United States Patent [19]
Lehmann et al.

[11] 3,984,669
[45] Oct. 5, 1976

[54] FULLY DIGITAL SPECTRUM ANALYZER USING TIME COMPRESSION AND DISCRETE FOURIER TRANSFORM TECHNIQUES

[75] Inventors: Joseph L. Lehmann, Sarasota, Fla.; Frank Lynch, Hatboro, Pa.

[73] Assignee: Weston Instruments, Inc., Newark, N.J.

[22] Filed: Dec. 20, 1974

[21] Appl. No.: 535,129

Related U.S. Application Data

[62] Division of Ser. No. 360,098, May 14, 1973, Pat. No. 3,881,097.

[52] U.S. Cl. .............................. 235/156; 324/77 D
[51] Int. Cl.² .......................................... G06F 15/34
[58] Field of Search ............ 235/156, 152; 324/77 B, 324/77 D; 179/15 BC

[56] References Cited
UNITED STATES PATENTS

| | | | |
|---|---|---|---|
| 3,344,349 | 9/1967 | Schroeder | 324/77 |
| 3,636,333 | 1/1972 | Klund | 235/156 |

OTHER PUBLICATIONS

C. Bingham et al., "Modern Techniques of Power Spectrum Estimation", *IEEE Trans. on Audio & Electroacoustics*, June 1967, pp. 56–66.

A. Eberhard, "An Optimal Discrete Window for the Calculation of Power Spectra", *IEEE Trans. on Audio & Electro.*, Feb. 1973, pp. 37–43.

*Primary Examiner*—David H. Malzahn
*Attorney, Agent, or Firm*—W. R. Sherman; K. McMahon; I. Kavrukov

[57] ABSTRACT

A fully digital spectrum analyzer accepting as an input either an analog signal or a series of digital numbers and using time compression and DFT (Discrete Fourier Transform) techniques to provide the spectral component values of the input signal. Novel techniques and means are used in obtaining the power values for selected spectral lines and in averaging these power values. Statistically controlled noise is added to the input of the spectrum analyzer to enhance its resolution beyond the resolution which would be otherwise available. Advanced and efficient techniques are used for generating and applying trigonometric functions in the course of finding the real and imaginary part of Fourier transforms, and for providing running averages of the power spectra.

10 Claims, 11 Drawing Figures

WHERE A IS THE FUND. FREQ. OF ($F_S/4$) SQ. WAVE
AND B IS THE FUND. FREQ. OF ($F_S/2$) SQ. WAVE (EXPONENTIAL MODE AVERAGING)

(SUM MODE AVERAGING)

FULLY DIGITAL SPECTRUM ANALYZER USING TIME COMPRESSION AND DISCRETE FOURIER TRANSFORM TECHNIQUES

This is a division of application Ser. No. 360,098 filed May 14, 1973, now U.S. Pat. No. 3,881,097.

BACKGROUND OF THE INVENTION

The invention is in the field spectrum analyzers and is specifically in the field of real time digital spectrum analyzers.

Spectrum analyzers are widely used in many diverse fields, such as vibration studies, radar and sonar return analysis, speech studies and the like, where it is desirable to know the frequency content of signals.

Early types of spectrum analyzers are the so-called scanning analyzers which in effect look at an input signal through a narrow band filter to detect the frequency content of the input signal corresponding to the filter bandwidth. The filter may be tunable, or the effect of a tunable filter may be achieved by using a fixed filter in conjunction with a heterodyne system. A major disadvantage of the scanning analyzers is that the filter looks at only one spectral component at a time. If a great number of spectral components are of interest, the analysis time becomes prohibitively long.

In order to reduce the analysis time, the single filter of the scanning analyzer can be replaced by a bank of filters, each looking at a different spectral component. Analyzers employing filter banks are faster than single filter analyzers, but are generally inflexible and expensive.

In order to reduce the analysis expense and improve flexibility, recent types of spectrum analyzers have used the techniques of time compression analysis and Fast Fourier Transform analysis.

Time compression analyzers convert the input signal to digital form and store the digital representation of the input in a memory. The stored digital values are read out a number of times and are applied each time to a heterodyne system of the type discussed above, with the tuning oscillator of the heterodyne system being stepped through the frequency range of interest each time the memory contents are read out. Since the memory is generally read out much faster than the input signal is read into it, the analysis time can be reduced substantially. See, for example, U.S. Pat. No. 3,715,509.

In Fast Fourier Transform spectrum analysis, the so-called Cooley-Tukey algorithm is used to find the Discrete Fourier Transform of a sequence of numbers which represent the time history of an input signal. A specially programmed general purpose digital computer may be used, or a special purpose FFT machine can be used to carry out the Fast Fourier Transform analysis of a sequence of numbers. See, for example, U.S. Pat. No. 3,573,446 and U.S. Pat. No. 3,586,843.

The desirable characteristics of spectrum analyzers include flexibility, ease of operation, accuracy and low cost. While the recent types of time compression spectrum analyzers and Fast Fourier Transform analyzers meet certain aspects of these desirable characteristics, the need still remains for a spectrum analyzer which utilizes both time compression and Discrete Fourier Transform analysis, which is flexible to allow selected trade-offs between accuracy and speed, and which is easy to operate and uses such techniques and components for processing the input signal that its initial and operational costs are low.

SUMMARY OF THE INVENTION

The invention is in the field of spectrum analyzers and specifically relates to fully digital spectrum analyzers which use time compression techniques and Discrete Fourier Transform analysis techniques.

An object of the subject invention is to provide a spectrum analyzer which is highly flexible to allow for selected trade-offs between speed and accuracy, which is easy to operate and maintain, and which uses advanced techniques and components so as to minimize initial and operational costs. An additional object is to provide a spectrum analyzer with an enhanced resolution.

A further object of the invention is to provide simple and efficient method and means for using Discrete Fourier Transforms for deriving the power spectra for a selected number of spectral lines.

A still further object of the invention is to provide simple and efficient method and means for averaging the power spectra over a selected interval in a sum mode and, if desired, in an exponential mode.

In a specific embodiment of the invention, a time-varying analog signal derived from a source such as a vibration transducer is suitably attenuated or amplified and is filtered, and is then combined with statistically controlled noise prior to conversion to digital form. The selection of the noise parameters is such that the resolution of the conversion to digital form is enhanced and becomes higher than the resolution which would be otherwise possible. The output of the analog-to-digital converter, which may be a single slope A/D converter, is a sequence of digital words which is stored in a first memory as it is generated at the A/D converter. The contents of the first memory are read out rapidly and each of the digital words from that first memory is multiplied by a selected window function which may be one of the conventionally used window functions or may be a special, custom designed window function. The window function multiplied digital words are stored in a second memory. The sequence of words stored in the second memory is then multiplied by trigonometric coefficients generated and used in a novel manner to generate a Discrete Fourier Transform representation of the sequence. This Discrete Fourier Transform representation is used to calculate the power values of a set of spectral lines from the contents of the second memory.

The calculated set of power values is stored in an averager memory. Successive sequences are analyzed as described above, and successive sets of power values may be averaged either in a sum mode alone, or in an additional exponential mode, and can be displayed on suitable displays.

Specific novel aspects of the invention include the techniques and the means for window function multiplication, for generating Discrete Fourier Transforms, for averaging, and for enhancing resolution by adding statistically controlled noise.

DETAILED DESCRIPTION

Figure 1:
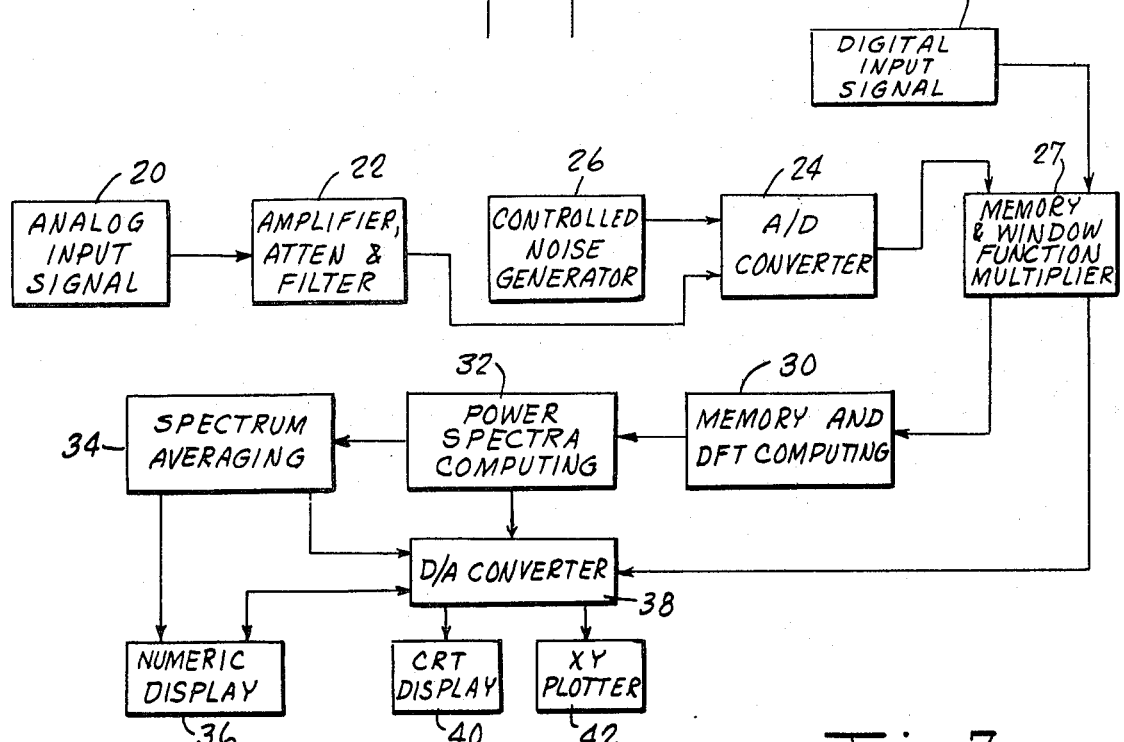
FIG. 1 is a simplified and generalized functional block diagram of the invented spectrum analyzer.

Referring to FIG. 1, which is a simplified and abbreviated functional block diagram of the spectrum analyzer, a source 20 provides an analog input signal which may be derived, for example, from a vibration transducer. The signal from the source 20 is generally a continuous analog signal varying in the time domain. The analog signal from the source 20 is suitably amplified or attenuated and filtered at 22, and is then applied to an analog-to-digital converter 24 to be converted into a series of digital words $f(n)$ which are successive samples of the analog signal from the source 20 and represent its time history.

Prior to conversion into digital form, the analog signal from the source 20 is combined with statistically controlled noise from a generator 26. As explained in detail below, this addition of statistically controlled noise is used to increase the resolution of the spectrum analyzer over and above what would be otherwise possible.

The digital words $f(n)$ are applied sequentially to a memory and a window function multiplier 27 for the purpose of varying the frequency selectivity of the spectrum analyzer by means of a window function (also called a weighting function or a convolution function). In effect, the output of the converter 24 is amplitude modulated by means of the memory and window function multiplication at 27.

If an already digitized input signal is available, as, for example, when the output of a vibration transducer has been previously digitized and stored in a suitable memory, digital words from a source 28 may be applied directly to the memory and window function multiplier 27.

The output of the memory and window function multiplier 27 is a sequence of digital words $f(n) \cdot W(n)$. These words are sequentially stored in a memory at 30, and the stored words are recirculated a number of times for computing the real and imaginary part of a Discrete Fourier Transform representation of the input signal, each recirculation being for a different one of a selected number of spectral lines distributed uniformly over a selected frequency range.

The real and imaginary part of the transform representation for each spectral line are squared and added at 32 to obtain a power spectrum value for the spectral line.

If desired, a succession of computed values of the power spectrum for each spectral line may be averaged at 34 either in a sum mode alone, or in an exponential mode which follows a sum mode averaging cycle.

The spectra averaged at 34 may be displayed at the numeric display 36, or may be applied to a D/A (digital-to-analog) converter 38 to be displayed in analog form at the CRT display 40 and at the XY plotter 42.

As a specific example, assume that in analog input signal from the source 20 is suitably amplified or attenuated and filtered at 22 and is applied to the analog-to-digital converter 24, together with suitable statistically controlled noise from 26. The analog signal, as modified by the added noise, is sampled at a suitable rate to generate successive analysis sequences of N digital words $f(n)$, each analysis sequence consisting of 1024 digital words. After suitably combining each of these digital words with a window function at 27, the result is a sequence of 1024 digital words $f(n) \cdot W(n)$, and these words are stored in the memory at 30. Then, assuming that there are 256 spectral lines of interest, the contents of the memory 30 are read out and circulated through a suitable arithmetic unit which computes the real part and the imaginary part of a Discrete Fourier Transform representation of the sequence of 1024 words $f(n) \cdot W(n)$ for each of the 256 spectral lines. These computed real and imaginary parts are combined at 32 to provide 256 values, each value representing the power spectrum of one of the 256 selected spectral lines. If averaging is desired, the power spectra values computed at 32 for each of a number of successive sequences of 1024 words $f(n) \cdot W(n)$ are averaged at 34, by keeping a running average thereof either in a sum mode alone, or in an additional exponential mode. The averaged values for each of the selected 256 spectrum lines may be displayed at the numeric display 36 and at the CRT display 40 and the XY plotter 42.

It is noted that the example of sequences of 1024 words $f(n)$ and 256 spectral lines is arbitrary, and that any other suitable numbers may be used.

Figure 2:
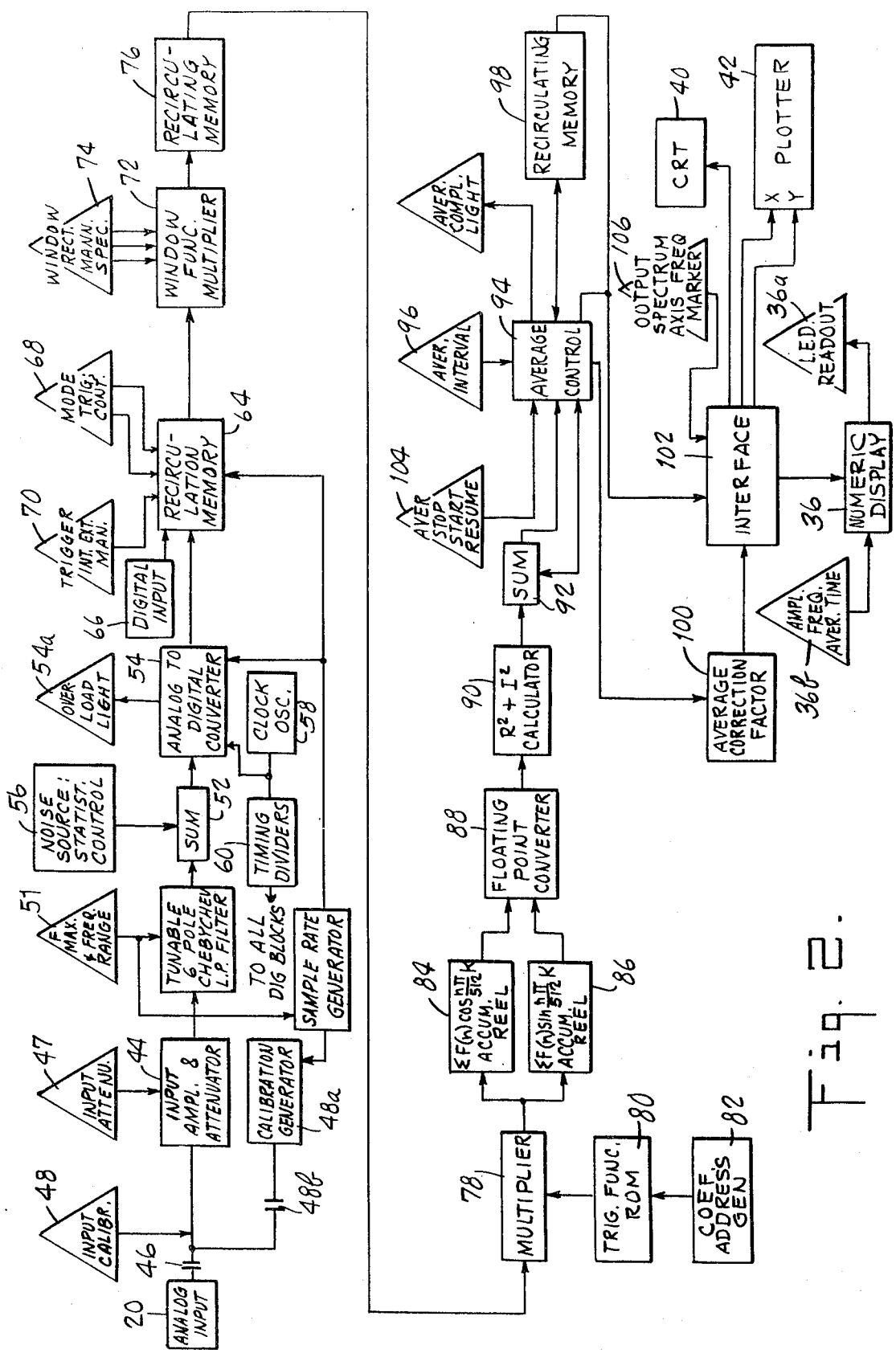
FIG. 2 is a more detailed functional block diagram of the spectrum analyzer.

Referring to FIG. 2, which is a more detailed functional block diagram of the spectrum analyzer, it is noted first that the indicated sequence of operations is not necessarily the time sequence in which actual operations are performed, but is only an exemplary information flow sequence. The actual time sequence of operations is explained in detail below in confjunction with the figures showing the circuitry for performing various operations.

In FIG. 2, a time-varying analog input signal from a source 20 is applied to an input amplifier and attenuator 44 through a DC isolation capacitor 46. The gain of the amplifier and attenuator 44 is controlled by means of an input gain control 47 such that, for example, an input voltage of 0.1 volts RMS corresponds to 0 db attenuation, etc.

An input calibration control 48 selects a calibration signal provided by a source 48a through a DC isolation capacitor 48b. The calibration signal may be, for example, a square wave having a 0.1 volt RMS fundamental frequency component at a frequency equal to one-eighth the rate at which the analog signal is later sampled for conversion to digital words. The exemplary sample rate is four times the highest frequency of interest; therefore the fundamental frequency of the square wave from the input calibration generator 48a is at the center of a frequency range selected for analysis. For example, is the frequency range from 0 to 25.6 Hz is selected for analysis, the frequency of the square wave from in input calibration generator 48a is 12.8 Hz.

The output of the input amplifier and attenuator 44 is applied to a tunable Chebychev filter 50 of conventional construction and operation providing approximately 60 db attenuation of signals which would cause aliasing error.

A control 52 is used to select one of a plurality of frequency ranges for analysis (i.e., to select the maximum frequency which is to be analyzed). For example, the selector 52 may be used to select a frequency range from 0 to 25.6 Hz, or one of several multiples thereof, the highest multiple being from 0 to 25.6 KHz. Each range is divided into 256 uniformly distributed spectral lines, and the equivalent noise bandwidth is the analysis range divided by the number of spectral lines. For example, if the analysis range is from 0 to 25.6 KHz, the line bandwidth for each spectral line is 100 Hz; if the analysis range is from 0 to 1024 Hz, the line bandwidth is 4 Hz; all this being for a rectangular window.

The analog signal output from the filter 50 is applied to an analog-to-digital converter 54 through a summing network 52. The summing network 52 also receives the output of a noise source 56 for noise whose statistical distribution is controlled in accordance with the subject invention. As explained in detail below, this addition of statistically controlled noise from the source 56 to the analog input signal of the spectrum analyzer provides resolution beyond that which would be otherwise available for the word length used in the analyzer.

The output of the analog to digital converter 54 is a sequence of digital words $f(n)$ representing successive samples of the filtered analog input signal from the source 20. The rate at which the analog signal is sampled by the analog-to-digital converter 54 is chosen to be four times the maximum analysis frequency at 51.

The basic timing of the spectrum analyzer is provided by a clock oscillator 58 which may, for example, operate at 45.87 MHz. Its output is applied directly to the analog-to-digital converter 54 to provide count pulses thereto, and is also applied to timing dividers 60 whose outputs are applied to all other blocks shown in FIG. 2 to serve as basic timing signals. A sample rate generator 62 is controlled by the frequency range selector 51 to provide suitable sample rate pulses to the calibration generator 48a, to the analog-to-digital converter 54 and to a recirculating memory 64. An overload light 54a indicates an overload condition of the analog-to-digital converter 54.

The recirculating memory 64 receives either the digital words from the analog-to-digital converter 54, or digital words from the digital input 66 which represent the time history of an already sampled signal. The recirculating memory 64 may have sufficient capacity to store 1024 words each eight bits long. The recirculating memory 64 starts storing eight bit words in one of two modes: trigger and continuous. In a continuous mode, the memory 64 stores the eight bit words from either the converter 54 or the digital input 66, as selected, until it contains a full sequence of 1024 words, then reads out its contents and, without further triggering, but after a suitable delay, starts storing a new sequence of 1024 words, etc. In a trigger mode, the memory 64 is triggered to start storing 8-bit words from either the digital input source 66 or the converter 54, and when each of its 1024 word locations is storing a word, it transfers out its contents, and repeats the cycle only when triggered again. The mode is selected by means of a selector 68. When the trigger mode has been selected by the selector 68, a further selector 70 is used to apply to the recirculating memory 64 one of three possible triggering sources: internal trigger, external trigger and manual trigger. The internal trigger is a suitable triggering signal derived, for example, from the analog input 20; the external trigger can be any suitable externally supplied triggering signal, such as a triggering signal derived from line frequency, and the manual trigger is a switch for manually triggering the recirculating memory 64.

After the recirculating memory is full, i.e., after it contains the full sequence of 1024 8-bit words, its contents are read out serially, at a high rate, and are applied to a window function multiplier 72. A control 74 is used to select either a rectangular window function, a Hanning window function, or a special window function stored in a suitable memory. Each of the 1024 8-bit words $f(n)$ provided by the recirculating memory 64 is combined with a selected window function by the window function multiplier 72, and the resulting sequence of 1024 words $f(n).W(n)$, which by this time are 9-bit words, is stored in another recirculating memory 76. The 1024 9-bit words stored in the memory 76 are read out at a high rate sequentially and nondestructively and are applied to a multiplier 78 as one of its two inputs. The other input of the multiplier 78 are trigonometric function values stored in a READ ONLY memory 80 which are read under the control of a coefficient address generator 82.

The purpose of the multiplier 78, the trigonometric function memory 80 and the coefficient address generator 82 is to provide R' and I' words defined and:

$$R' = f(n).W(n) \cos (2\pi nK/N\text{-g})$$

$$I' = f(n).W(n) \sin (2\pi nK/N\text{-g})$$

where $f(n).W(n)$ represents the n-th of the sequence of 1024 (=N) words from the recirculating memory 76, K represents one of the 256 spectral lines, and g is a constant. (Note that the actual computation, described below in connection with the actual circuitry, involves a somewhat modified expression for R' and I'.)

To compute the R and I words, each of the 1024 9-bit words from the recirculating memory 76 is multiplied by the cosine function whose argument includes a value of 1 for K representing the first spectral line and by a sine function including a value of 1 for K for the same first spectral line, then the procedure is repeated for arguments including a K value of 2 representing the second spectral line, etc. until the K value of 256 for the last of the 256 spectral lines has been used. For each spectral line, the 1024 values representing the expression $(1/N)R' = R$ are summed in an accumulator 84, while the 1024 words representing the values of the expression $(1/N)I' = I$ for each spectral line are summed in an accumulator 86.

For each spectral line, the entire contents of the recirculated memory are applied to the multiplier 78, and the accumulators 84 and 86 each sum a sequence of 1024 values. Then, for the next spectral line, the contents of the accumulators 84 and 86 are transferred to the network concerned with power spectra calculation and averaging, and the accumulators 84 and 86 are cleared to prepare each for summing another sequence of 1024 values associated with the succeeding spectral line. After the entire contents of the recirculating memory 76 have been processed in the indicated manner 256 times, the accumulator 84 has contained sequentially the 256 words representing the real part of a Discrete Fourier Transform representation of the 256 spectral lines, while the accumulator 86 has contained sequentially the corresponding imaginary parts of said representation.

In order to calculate the power spectrum value for each spectral line, following the summation in the accumulators 84 and 86 of the two sequences of 1024 products associated with a spectral line, the contents of the accumulators 84 and 86 are read out, converted to a floating point form at a converter 88, and are applied to a calculator 90 which squares the two values and finds the square root of their sum. The output of the calculator 90 is a series of 256 words in floating point format, each work representing the power of one of the 256 spectral lines.

A selected number of successive power spectra (successive sets of 256 power spectra words) may be averaged under the direction of an averger control 94.

To average power spectra, successive sequences of 1024 8-bit words are read into the recirculating memory 64 and are processed as described above, with the result that the calculator 90 provides at its output successive sets of 256 power spectra words. Assume that an averaging interval has been selected by means of a control 96 such that 1024 successive sets each comprising 256 spectral lines power values are to be averaged. The first set of 256 power spectra values from the calculator 90 pass through the summing device 92 and through the averager control 94 and are stored in a recirculating memory 98, whose capacity may be 256 words each 20 bits long. For the next set of 256 values from the calculator 90, the power spectrum value for each spectral line stored in the recirculating memory 98 is added, by the summing device 92, to the corresponding line value from the calculator 90 and the sum of these two values for the same spectral line is stored in the place for that spectral line in the recirculating memory 98. This process continues until 1024 sets of 256 power spectra $X_K$ (K identifies the spectral line whose power value is X) have been so accumulated in the recirculating memory 98.

Since it is desirable to provide a running average of the power spectrum value for each spectral line, each of the words $X_{K,p}$ (where $p$ is the number of words $X_K$ which have been summed so far) in the recirculating memory 98 is divided by 2 each time $p$ is an integer power of 2. In order to provide a true running average during the time between divisions by 2, an averager correction factor source 100 provides correction factors correlated with the value of $p$, i.e., with the number of spectral sums comprising the contents of the memory 98. The contents of the memory 98 and the correction factors from the averager correction factor source 100 are applied to an interface 102 whose purpose is to combine the output of the recirculating memory 98 with the correction factors from the unit 100 and to provide a digital output to the numeric display 36 and its LED (light emitting diode) readout 36a, and to provide analog output to the XY plotter 42 and to the CRT 40, such that the displays can show only true running averages.

Averaging can be started, stopped or resumed by means of a control 104; a selected spectrum frequency line may be marked by means of a control 106; and the amplitude in dbs, the frequency in Hz and the averaging time (i.e., the time remaining to complete an averaging cycle) are displayed by the numeric display 36 when selected by a control 36b. If no averaging is desired, the control 104 is set to "average" only a single set of 256 power spectra.

The particularly novel feature of the spectrum analyzer described above include: enhancement of resolution by means of the statistical noise added to the analog input signal prior to the digital sampling thereof; the techniques and circuitry used for finding the power spectra, and the techniques and circuitry used in averaging. Additionally, novel methods and means are employed in carrying out various arithmetic operations.

Before explaining in detail the means of extending the resolution of the analog-to-digital converter 54 by means of the statistically controlled noise from the source 56, it may be helpful to illustrate the underlying principles by a simplistic example. The example uses decimal numbers (rather than the binary code actually used in the analyzer) and does not take into account bandwidth considerations. For the purposes of the example, assume that an analog-to-digital converter has quantum steps of one volt, e.g., any analog voltage signal between 0.6 and 1.5 volts inclusive is converted to a decimal value of one volt, any analog signal with a voltage value of between 1.6 and 2.5 volts inclusive is converted to a decimal signal of 2 volts, etc. Also assume that each decimal value results from ten successive and redundant samples of the analog signal. Now assume that a noise signal is added to the analog signal prior to its conversion to a decimal value, and that the noise signal is controlled such that it has a different specified value for each of the ten redundant samples. Specifically, for the ten redundant samples resulting in one decimal value, the voltage of the noise signal at the sampling instant is, successively: $-0.5$, $-0.4$, $-0.3$, $-0.2$, $-0.1$, 0.1, 0.2, 0.3, 0.4 and 0.5. Assume that an analog voltage whose true value is 1.2 volts is to be converted. Without any addition of noise, it would be converted to a decimal value of 1 volt. With the addition of the noise described here, the decimal value resulting from each of the first eight samples would be one volt, while the decimal value resulting from each of the last two samples would be 2 volts. If these ten successive samples are averaged, the result would be 1.2 volts, which is the true value of the analog signal, this value having a resolution which is one order of magnitude better than otherwise possible.

In the context of the spectrum analyzer discussed here, the technique extends the resolution of a M-bit analog-to-digital converter to less than $A_m 2^{-M}$, where $A_m$ is the full scale input signal and M is the number of binary bits of the digital output of conversion. The technique provides a tradeoff between extended resolution and maintaining a relatively low sampling rate for a given maximum frequency of the input analog signal. Usually the rate $f_s$ at which an input analog signal is sampled for analog-to-digital conversion must be greater than the theoretical minimum (which is twice the maximum bandwidth $f_m$ of the input analog singal) due to the nonideality of presampling and interpolation filters.

An important discovery embodied into the subject invention is that a sampling rate which is higher than the theoretical minumum can be utilized to extend analog-to-digital conversion resolution without further increase of the sampling rate and without increasing the number of bits of the resulting digital word.

The invented method and means for increasing resolution require the addition of a specified random characteristic noise signal to the analog input signal prior to quantization. the noise signal should ideally have an amplitude probability density function which is zero except over the interval from $$A_m(-2^{-(M+1)}) \text{ to } A_m(+2^{-(M+1)})$$

Over the nonzero interval, the amplitude probability density function should be a constant value, which is $2^M/A_m$. The noise signal should ideally have a power density spectra which is 0 over the frequency intervals $$Q.f_s-f_m \text{ to } Q.f_s+f_m \text{ for } Q = 0, 1, 2, \ldots$$

so that none of the noise energy would be in the frequency interval of the input analog signal following sampling.

An input analog signal having a maximum bandwidth of $f_m$ can be defined by a set of $2f_m t$ independent samples over the interval of time t. If the input analog signal is sampled at a rate of $Qf_m$, where Q is greater than 2, and is subsequently quantized, the redundant information resulting from the successive samples can be used, in accordance with the invention, to increase the effective number of quantization levels. This can be done by averaging each sequence of Q/2 samples following quantization, with the result of $Q.f_m t/(Q/2)$, or $2f_m t$ averaged samples over the time interval $t$. The value of the averaged sample can assume Q/2 times as many discrete levels as the levels of the originally available quantization. This results from solving $$(2/Q) \sum_{i=1}^{Q/2} S_i$$

where $S_i$ is the i-th sample. If the noise defined here is added to the input analog signal prior to quantizing, the average of the sequence of samples Q/2 approaches the actual value of the input analog signal regardless of the quantization span as Q approaches infinity.

Figure 3:
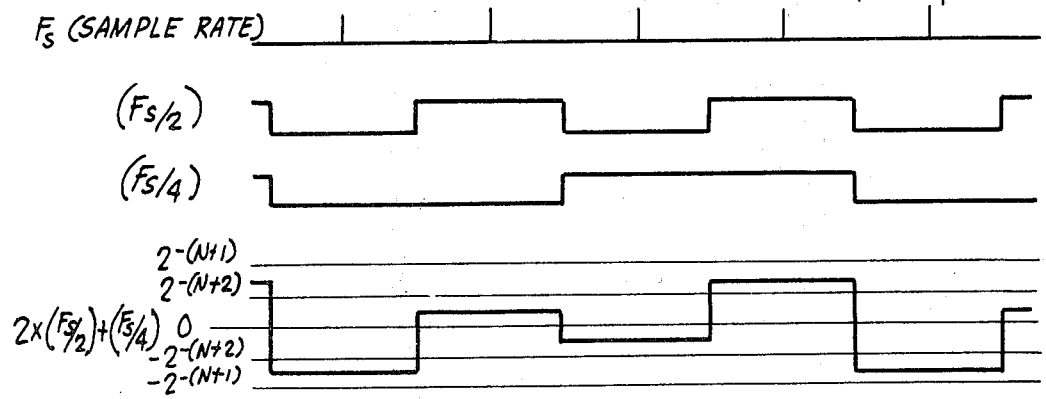
FIG. 3 is a timing diagram of signals used in extending the resolution of the spectrum analyzer.

Referring to FIGS. 2 and 3, the rate at which the analog-to-digital converter 54 samples the analog signal at its input is $F_s$ (the top curve in FIG. 3). As described earlier, the sampling rate depends on the frequency range selected for analysis and is four times the highest frequency of the analysis range. For example, if the frequency range of 0–256 Hz has been selected for analysis, the sampling rate $F_s$ is 1024. The sampling frequency $F_s$ is obtained by time division of the frequency of the clock oscillator 58 and is provided by the sample rate generator 62.

The controlled noise from the generator 56, which is used in accordance with the invention to extend the resolution of the analog-to-digital converter 54 to less than $2^{-M}$ times the maximum input signal, where M is the number of bits in the digital word output by the converter 54, must have a constant amplitude probability density over the range of $\pm A_m 2^{-(M+1)}$. Another requirement is that the noise be essentially white up to a frequency equal to the maximum frequency of the selected analysis range, and that the noise contain no line components which would fold over into the selected frequency range following sampling.

The noise source 56 approximates constant amplitude probability density by adding two square waves and the output of a normally distributed white noise generator. One of these square waves is at one-half the sampling rate $F_s$, and the other square wave is at ¼th the sampling rate $F_s$. The two square waves are shown as the second and third curves from the top in FIG. 3. The amplitudes of the square waves are summed such that the resulting amplitude takes discrete values at $\pm A_m 2^{-(M+3)}$ and at $\pm A_m 3 \times 2^{-(M+3)}$. (The sum of the two square waves is the bottom curve in FIG. 3).

Figure 4:
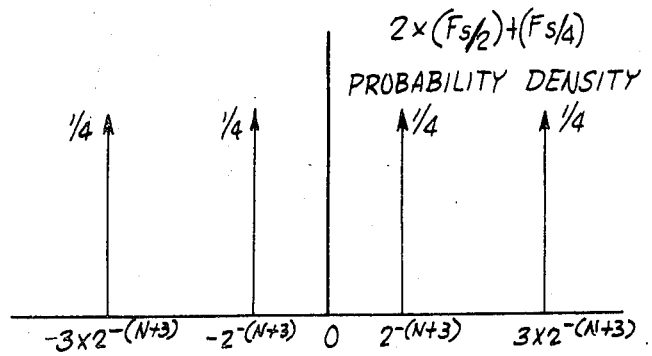
FIG. 4 is a plot of the probability density of a noise signal used in enchancing resolution.

The amplitude probability density function of the summed square waves of FIG. 3 is four equal area impulse functions, which are illustrated in FIG. 4.

Figure 5:
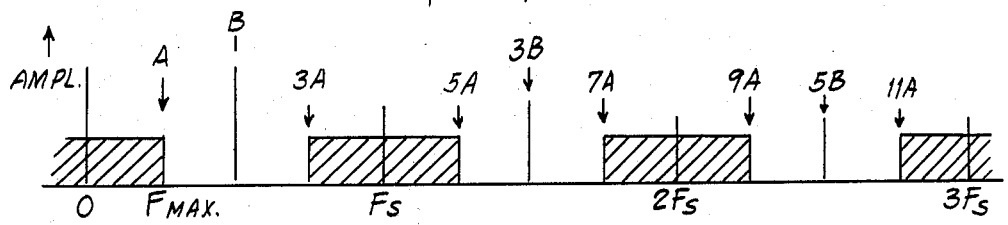
FIGS. 5 and 6 are plots of the probability density of the noise signal.

The spectral energy of the summed square waves lies outside the frequency band of the sampled analog input signal, as illustrated in FIG. 5. Only the components of the summed square waves about zero frequency are shown in FIG. 5 for clarity. Their spectra due to translation by multiples of the sampling rate frequency $F_s$ can be seen by shifting the frequency axis of FIG. 5, still producing no frequency components within the frequency band of the sampled input analog signal.

Figure 6:
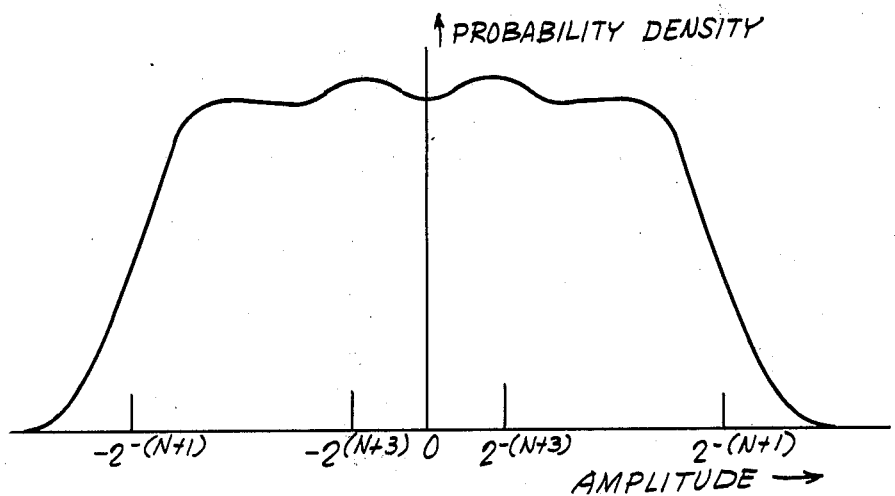

When a normally distributed white noise having an RMS amplitude of approximately $0.9 \pm 2^{(M+3)}$ times the maximum amplitude of the analog input signal is added to the summed square waves, the resulting signal has an approximately constant amplitude probability function, as shown in FIG. 6, and a minimum white noise energy over the frequency range of the sampled analog signal.

Figure 7:
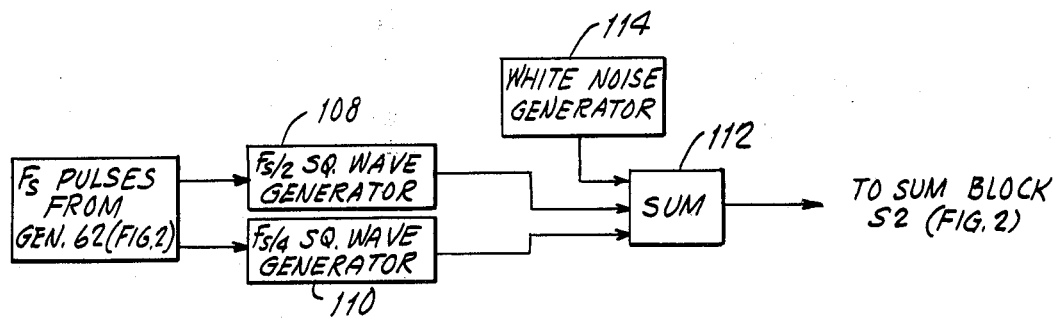
FIG. 7 is a functional block diagram of the portion of the spectrum analyzer relating to enhancing resolution.

A simplified block diagram of a noise generator to provide the input to the summing network 52 (FIG. 2) is illustrated in FIG. 7. In FIG. 7, the sampling frequency from the generator 62 (FIG. 2) is used to drive a square wave generator 108 producing a square wave at half the sampling frequency $F_s$ and a square wave generator 110 producing a square wave at ¼th the same sampling frequency. The outputs of the generators 108 and 110 of FIG. 7 are illustrated in FIG. 3 in proper phase relationship to the sample rate frequency. The two square waves from the generators 108 and 110 are added in a summing network 112 to each other and to white noise from a generator 114, so that the output of the summing network 112 is the desired noise signal which is added to the input analog signal in the summing network 52 of FIG. 2.

While the above discussion of resolution enhancement relates only to binary coded numbers, it should be clear that analogous used thereof may be made for other number systems. A full description of this is provided in the co-pending patent application of the same invention entitled "Enhancing the Resolution of Analog-to-Digital Conversion by Adding Statistically Controlled Noise to the Input Analog Signal" and filed concurrently with this patent application, on May 14, 1973 under Ser. No. 360,071 now U.S. Pat. No. 3,877,022.

Referring back to FIG. 2, the output of the analog-to-digital converter 54, or a digital input provided by the input 66, is a sequence of words $f(n)$. These words $f(n)$ are stored in a recirculating memory 64, and are then multiplied by a selected window function at the multiplier 72, resulting in a sequence of words $f(n).W(n)$, which are stored in a recirculating memory 76.

As discussed and generalized above, the trigonometric functions $$\cos(2\pi/N)(nK-K+\tfrac{1}{2}) \text{ and } \sin(2\pi/N)(nK-K+\tfrac{1}{2})$$

are used in calculating the real and imaginary part respectively of the power spectrum value for the spectral line K. In calculating the power spectrum values, n varies from 1 to 1,024 and K varies from 1 to 256.

A unique algorithm and unique apparatus embodying this algorithm are used in the invented analyzer for the arithmetic operations involved in calculating the power spectrum values and for calculating the sine and cosine expressions given immediately above. Specifically, a READ ONLY memory (ROM) is used to store 256 eight bit words representing the trigonometric coefficients for one quadrant of a wave cycle, and a novel and efficient techniques are used to address the ROM by a simply calculated address which gives the required sine and cosine values at any point of a cycle, as needed in carrying out the power spectrum calculations.

Specifically a value V is defined as follows:

$$V = (255/256)\sin[(\pi/512)(U - \frac{1}{2})]$$

for any value of U between 0 and 255 inclusively (first quadrant). The corresponding cosine expression, for the first quandrant, is obtained through the relationship $\cos\alpha = \sin(\pi/2-\alpha)$ by using the 1's complement of U ($\overline{U}$) of the sine address U to the ROM address imput. Sines and cosines in the other three quadrants are derived by the relationships $$\sin[m(\pi/2) + U] = \sin(m\pi/2)\cos U + \cos(m\pi/2)\sin U$$

$$\cos[(m\pi/2) + U] = \cos(m\pi/2)\cos U - \sin(m\pi/2)\sin U$$

as summarized in the following table:

|  |  | 1st Quadrant (m=0) | 2nd Quadrant (m=1) | 3rd Quadrant (m=2) | 4th Quadrant (m=3) |
|---|---|---|---|---|---|
| Sine | (Sign | + | + | − | − |
|  | (ROM Address | U | $\overline{U}$ | U | $\overline{U}$ |
| Co-sine | (Sign | + | − | − | + |
|  | (ROM Address | $\overline{U}$ | U | $\overline{U}$ | U |

The required coefficients are: $\sin(\pi/512)[(n-1)K+\frac{1}{2}]$ and $\cos(\pi/512)[n-1)K+\frac{1}{2}]$, which are equal to $\sin(\pi/512)[(nK-K)+\frac{1}{2}]$ and $\cos(\pi/512)[(nK-K+\frac{1}{2}]$ respectively.

The generation of the necessary trigonometric coefficients and their multiplication is carried out in the following functional steps:

1. The value (nK-K) is computed.
2. The least significant eight bits of the computed value (nK-K) are used as the term U.
3. The ninth and tenth bits are used to determine the quadrant according to the following table:

| bit 9 | bit 10 | quadrant |
|---|---|---|
| 0 | 0 | 1st |
| 0 | 1 | 2d |
| 1 | 0 | 3d |
| 1 | 1 | 4th |

4. All bits beyond the tenth bit are disregarded because they represent multiples of wave cycles.
5. The calculated value for U (or for $\overline{U}$) is used as the address to a READ ONLY memory in accordance with the quadrant table given above.
6. The sign of the ROM output is determined according to the quadrant table above.
7. The sine coefficient and the cosine coefficient are generated.
8. The generated sine and cosine coefficients are multiplied with the corresponding $f(n).W(n)$ words and the result is summed in the respective R and I (Real and Imaginary) accumulator register.

Figure 8:
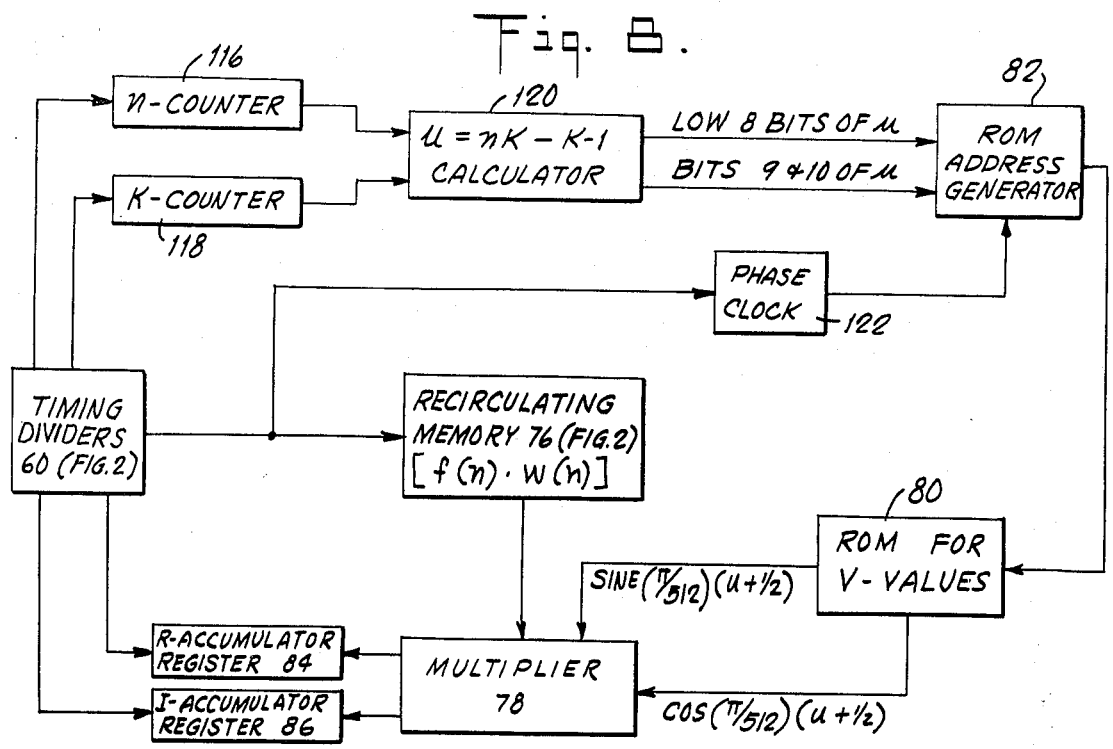
FIG. 8 is a block diagram of the portion of the spectrum analyzer relating to calculating power spectra of time compressed signals by Discrete Fourier Transforms.

Referring to FIG. 8, which illustrates exemplary means for carrying out the calculations discussed immediately above, an n-counter 116 is driven by the timing dividers 60 and provides at its outputs a number identifying the rank (within the sequence of 1024 words) of the word $f(n).W(n)$ which is currently read out from the recirculating memory 76 and is applied to the multiplier 78. The output of the counter 116 is a positive integer which takes successively the values of 1 thorugh 1024. A K-counter 118 is driven by the same timing dividers 60 and provides at its output the rank (within a set of 256) of the spectral line whose power spectrum is currently calculated. There are 256 spectral lines, and the output of the K-counter 116 is a positive integer which takes successively the values of 1 thorugh 256. All 1024 words from the memory 76 are applied to the multiplier 78 for each spectral line (i.e., for each value from the K-counter 118, the n-counter 116 cycles through its 1024 successive output values).

A calculator 120 finds the value for the expression U = nK-K as determined by the current outputs of the counters 116 and 118. For each value of K, the calculator 120 outputs 1024 different values of U corresponding to the 1024 different values from the n-counter 116. The output of the calculator 120 in in binary form, and the low eight bits are used in calculating the address of one of the 256 words stored in the ROM 80. These eight bits are applied to the ROM address generator 82. The ninth and tenth bits of the output of the calculator 120 are also applied to the ROM address generator 82 and are used by suitable switching logic to carry out the logic defined by the table given above, which determines the sign and complements the low 8 bits according to the quadrant which should be represented by the contents of the ROM 80. Each of the 256 words in the ROM 80 is the value of a trigonometric coefficient expressed by an 8-bit binary number, and the words read out from the ROM 80, as addressed from the address generator 82, are applied to the multiplier 78.

Under the control of a phase clock 122, which in turn is controlled by the timing dividers 60, the word read from the ROM 80 during the first phase of each clock pulse from the clock 122 is the sine coefficient, while the word read from the ROM 80 during the second phase of the same clock pulse from 122 is the cosine coefficient, these coefficients being for the current values of n and K as output by the counters 116 and 118 respectively. Each of the two outputs of the ROM 80 is multiplied, by the multiplier 78, with the current output of the recirculating memory 76. Each multiplication is for the same value of n currently provided by the counter 116. The output of the multiplier 78 which includes the cosine coefficient is accumulated in the R accumulator register 84, while the sine coefficient output of the multiplier 78 is accumulated in the I-accumulator register 86.

Before a power spectrum calculation cycle starts, the R and I accumulator registers 84 and 86 are cleared to 0. Then the R accumulator 84 accumulates each of the 1024 words including a cosine coefficient that are output for the single current value of K, while the I-accumulator register 86 accumulates the corresponding 1024 words (for the same value of K) that include the sine coefficients. At the end of a cycle of the n counter through 1024 values, the accumulator registers 84 and 86 contain the values R and I which can be used to calculate the power spectrum $X_K$ of the spectral line identified by K according to the following relationship:

$$X_K = (R_K)^2 + (I_K)^2$$

This is carried out in the calculator 90 (FIG. 2).

Referring back to FIG. 2, successive sets of 256 power spectra from the calculator 90 may be averaged either in a sum mode (integral mode) alone, or in an additional exponential mode as well. The algorithm embodied in the means for averaging in the sum mode is $$Av._{sum} = (aY_{K,p-1} + 2^{-b} X_{K,p})2^b/P$$

where $X_K$ represents the K-th line of a set of 256 power spectral lines (derived from a sequence of 1024 words f(n), as described earlier), p is the number of sets of power values for 256 spectral lines each which have been averaged so far, $Y_{K,p-1}$ is the value of the expression in the parenthesis prior to the current p-th spectra, $X_{K,p}$ is the power value of the K-th spectral line of the p-th set, b is an integer defined by $2^{b-1} < p \leq 2^b$, and a is ½ if $p-1 = 2^{b-1}$ and is 1 otherwise.

Figure 9:
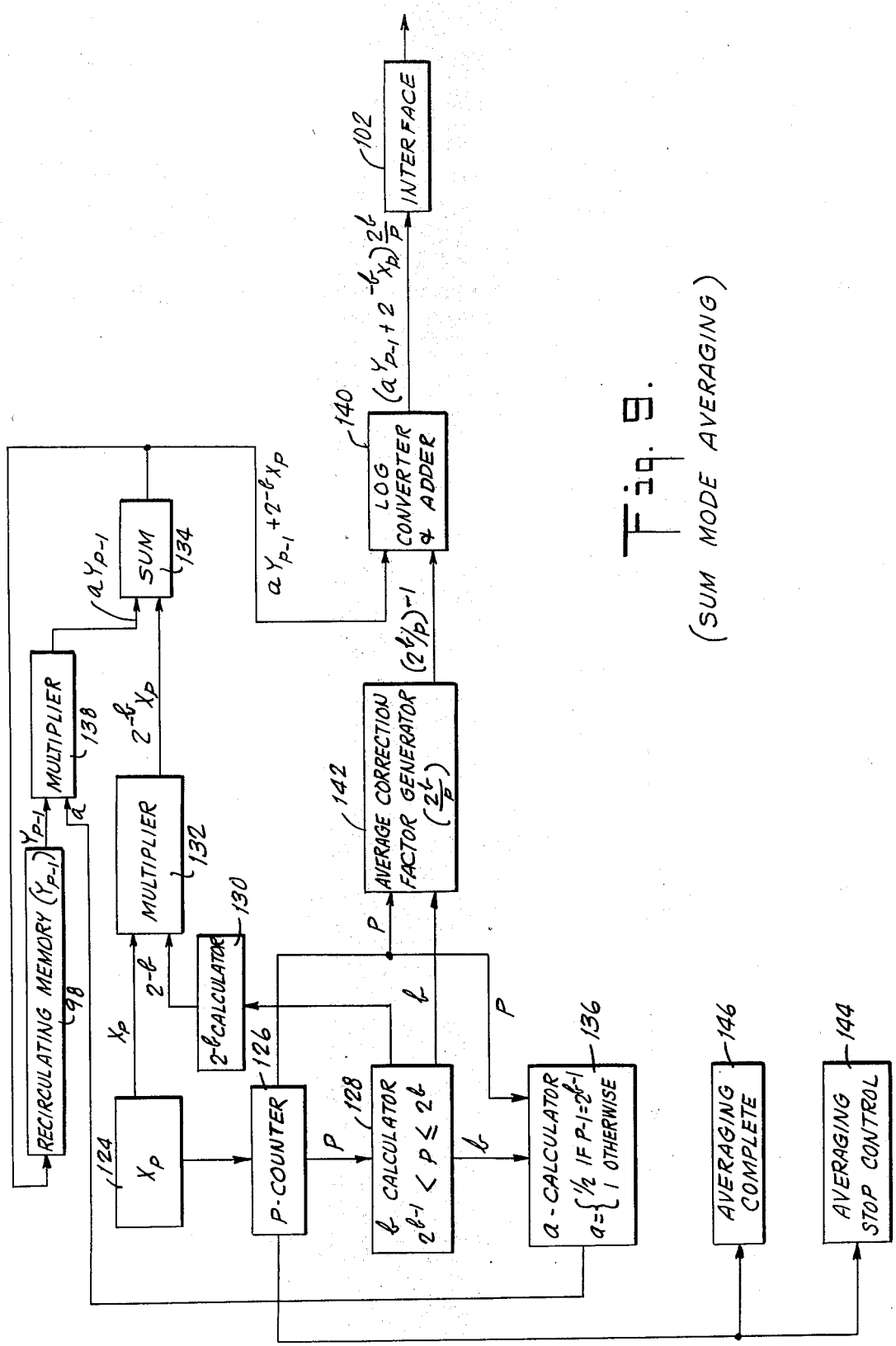
FIG. 9 is a block diagram of the portion of the spectrum analyzer relating to sum mode averaging of power spectra.

The averaging portion of the spectrum analyzer embodying the above algorithm is illustrated in FIG. 9. In FIG. 9, a generator 124 outputs serially successive sets of 256 serially arranged power values of spectral lines derived from the calculator 90 in FIG. 2. A p-counter 126 keeps track of the number of sets of power spectra which have been averaged, and the current value of p in binary code is supplied to a calculator 128 which determines the value of b by detecting the bit location of the most significant one in the (p-1) word. The detected bit position, counting the LSB position as position 1, is the value b. The value of b from the b-calculator 128 is supplied to a calculator 130 which calculates the value of the multiplier $2^{-b}$. The value of this multiplier $2^{-b}$ is applied to a multiplier 132 whose other input represents the series of power spectra $X_{K,p}$. Each of the power spectra values for the same value of p is multiplied by the multiplier $2^{-b}$, and the output of the multiplier 132, which is represented by the expression $2^{-b} \cdot X_{K,p}$, is one of the inputs of a summing network 134.

To derive the other input of the summing network 134, the value b calculated at 128, and the current value of p from the p-counter 126 are supplied to an a-calculator 136 which outputs a value of a that is ½ if the equation $p-1 = 2^{b-1}$ is satisfied, and a value for a of 1 if this equation is not satisfied. This value of a calculated at 136 is applied to a multiplier 138 whose other input represents the accumulated power values of each of the 256 spectral lines whose power spectra are being averaged (of course, when the first set of values $X_{K,p}$ of an averaging cycle are being processed, the recirculating memory 98 is empty). The output of the multiplier 138 is represented by the expression $aY_{K,p-1}$, and is applied as the second input of the summing network 134. The output of the summing network 134 is represented by the expression $aY_{K,p-1} + 2^{-b}X_{K,p}$ and is applied both to the recirculating memory 98, to replace the contents of its location for the K-th spectral line, and to a log converter and adder 140. The other input of the log converter and adder 140 is an averager correction factor represented by the expression $p/2^b$ which is derived from an averager correction factor generator 142 whose inputs are the current p value from the p-counter 126 and the current b value from the b-calculator 128.

The log converter and adder 140 performs two distinct functions: it converts each of its inputs to a log function, and it subtracts the $\log_2(P/2^2)$ value from the $\log_2(aY_{K,p-1} + 2^{-b} X_{K,p})$ value. The output of the log converter and adder 140 is represented by the expression $(aY_{K,p-1} + 2^{-b} X_{K,p})2^b/p$, and is the true running average of the power spectra from the calculator 90 in FIG. 2 in $\log_2$ form.

This true running average is applied to the interface 102 for numeric or analog display as discussed in connection with FIG. 2. When a desired preset number of sets of 256 power spectra lines each have been averaged, for example, when 1024 such sets of power spectra lines have been averaged, the averaging cycle may be stopped. To do this, the output of the p-counter 126 representing the decimal number 1024 may be gated to a control network 144 for stopping the averaging cycle and to an average complete indicator 146 to indicate that the averaging in the sum mode over the preset interval has been completed.

The contents of the recirculating memory 98 represent the true running average only after an averaging cycle for a set of power spectra whose p number is an integer power of 2, i.e., the contents of the recirculating memory 98 are a true running average only just after the first, second, fourth, eighth, sixteenth, etc. set of power spectra $X_{K,p}$ that have been averaged. The averaging of the contents of the recirculating memory 98 after p has been an integer power of 2 is accomplished very simply in the multiplier 138, since it represents merely a one-bit shift of a binary number toward its least significant bit (LSB). Thus, the multiplier 138 need only be a shift register, which is triggered when a is ½ to shift each of the 256 binary numbers applied serially to it from the recirculating memory 98 one binary bit toward the LSB. Similarly, the multiplier 132 need only be a shift register which shifts each of the binary numbers representing the current power spectra as many bits toward the least significant bit as indicated by the current value of b from the calculator 128. The calculator 130 is merely a gating network indicating the number of shifts by 1 binary bit to be performed by the shift register serving as the multiplier 132. Similarly, the average correction factor generator 142 need not be a multiplier or a divider, but need only perform a suitably gated shifting operation. Specifically, the generator 142 may be a shift register which stores the current value of p (in binary code) provided by the p-counter 126, and shifts the stored value of p toward the LSB by as many bit positions as the decimal value of the b-value provided by the b-calculator 128.

Figure 10:
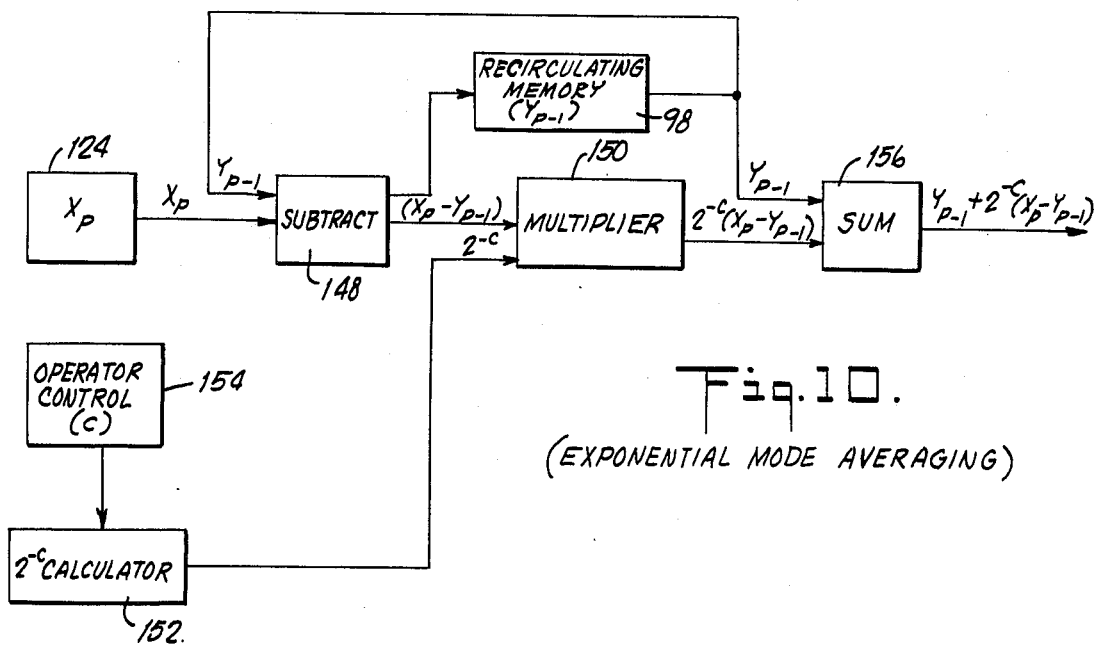
FIG. 10 is a block diagram of the portion of the spectrum analyzer relating to exponential mode averaging of power spectra.

When averaging in the exponential mode, i.e., after a sum mode average has been obtained, the averaging is represented by the expression $$Av._{exp.} = Y_{K,p-1} + 2^{-C} (X_{K,p} - Y_{K,p-1})$$

where $C = \log_2$ of the number of spectra averaged in the preceding sum mode averaging. An illustrative block diagram of means for carrying out exponential mode averaging is shown in FIG. 10 where the current set $X_K$ of 256 power spectra is supplied from the $X_K$ generator 124. The value C, which is the $\log_2$ function of the number of sets of power spectra averaged in the sum mode, is supplied from an operator control 154. The current contents of the recirculating memory 98 for each spectral line are subtracted from the power spectrum value for the same spectral line at a subtracting network 148 whose output is represented by the expression $(X_{K,p} - Y_{K,p-1})$ and is applied as one of the two inputs of a multiplier 150. The other input of the multiplier 150 is a multiplication factor $2^{-C}$ which is derived from a calculator 152, with the value of C provided from the operator control 154. The output of the multiplier 150 is represented by the expression $2^{-C}(X_{K,p} - Y_{K,p-1})$, and is added to the outputs of the recirculating memory 98 in a summing network 156. The summing network 156 adds serially the values corresponding to the same spectral line. The output of the summing network 156 is represented by the expression $Y_{K,p-1} + 2^{-C}(X_{K,p} Y_{K,p-1})$ which is the exponential mode averaged power spectra.

A specific embodiment of a circuit which receives the output of the recirculating memory 64 of FIG. 2 and provides the power values for the successive spectral lines discussed above is shown in FIG. 11.

Figure 11:
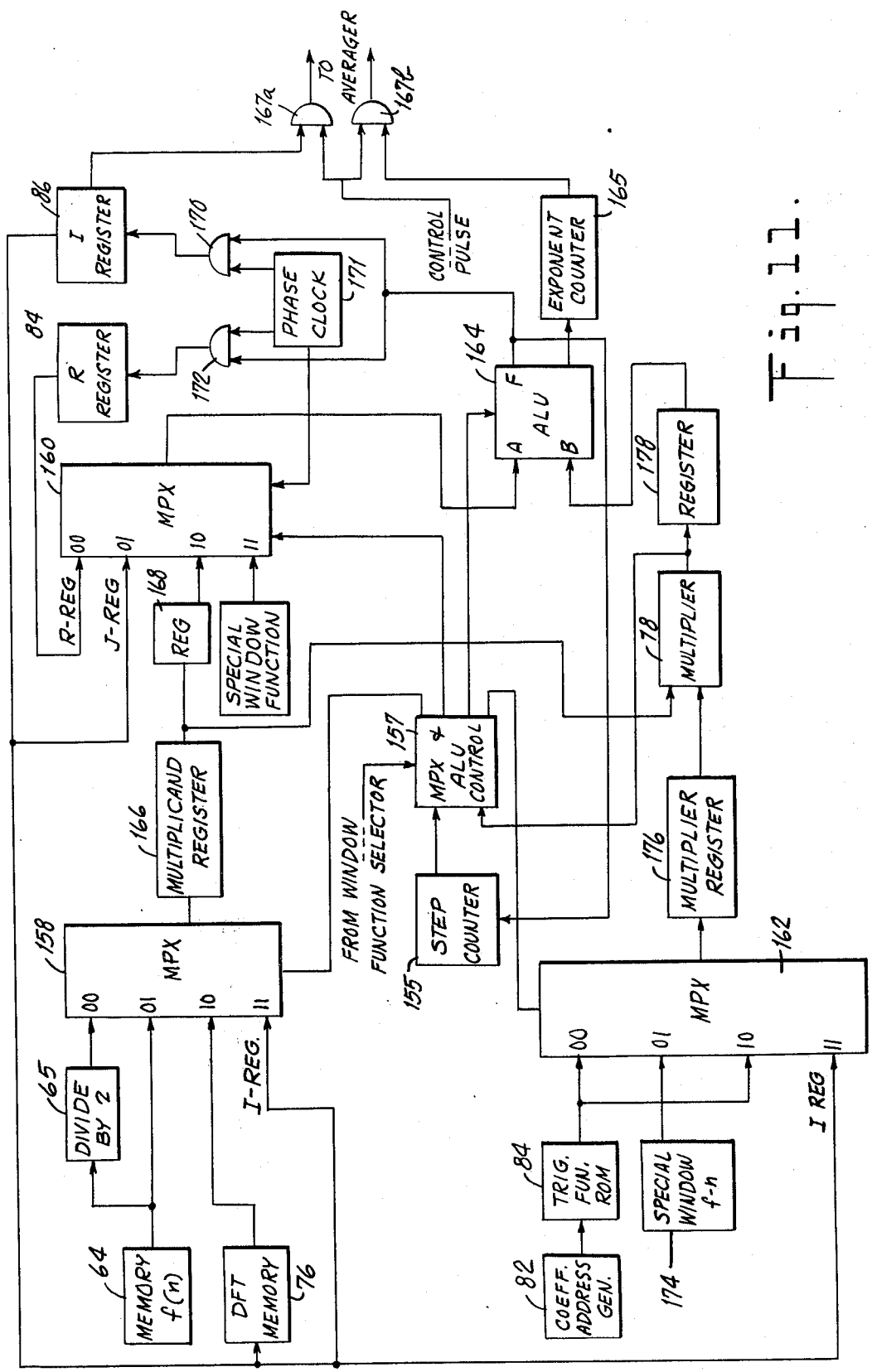
FIG. 11 is a block diagram of a specific circuit for carrying out Discrete Fourier Transform calculations and for window function multiplication.

Referring to FIG. 11, a step counter 155 is driven by the timing dividers 60 of FIG. 2 and counts through the following succession of steps:

Step 0 is the step in which the circuit of FIG. 11 is ready to start operating. Operation starts when a sequence of words $f(n)$ start at the output of the memory 64.

Step 1 is reserved for multiplying each of the words $f(n)$ from the memory 64 by the selected window function and placing them in the DFT memory 76. This step takes 1024 clock cycles, one clock cycle for each of the sequence of 1024 words $f(n)$.

Step 2 is a timing delay of two clock cycles.

Step 3 is dedicated to multiplying each of the words $f(n).W(n)$ which are now in the memory 76 by the selected trigonometric functions discussed above and for accumulating the results of the multiplication. This step takes 1024 clock cycles.

Step 4 is reserved for performing a two's complement inversion (if required) of the results of step 3. The step takes two clock cycles.

Step 5 is devoted to converting the results of steps 3 and 4 into floating point. This step takes from 2 to 16 clock cycles depending on how many shifts are required for conversion to floating point.

Step 6 is devoted to squaring and summing the real and imaginary part of the result obtained in step 5. The step takes one clock cycle.

Step 7 is reserved for floating point adjustment of the result of step 6, if required, and for outputing the adjusted result. This step takes one clock cycle.

Referring to FIG. 11, the step counter 155 may be a counter with the necessary gates to count the clock cycles for the steps discussed immediately above. The output of the step counter 155 is a series of control pulses which are applied to a control circuit 157 for issuing control signals to multiplexers 158, 160 and 162 and to an arithmetic logic unit 164. The control circuit 157 comprises a combinatorial logic of gates for issuing the control signals discussed here upon the occurrence of the discussed conditions.

When the step counter 155 advances from its 0 step to its step 1, the control circuit 155 decodes this advance to set the multiplexers 158 to 160 and 162 and the arithmetic logic unit (ALU) 164 depending on the control signal applied to it from the window function selector 74.

As an example, if the selected window function is the rectangular window function, the control circuit 157 sets the multiplexer 158 such that its 01 input is connected to its output, while all its other inputs are disconnected from the output, sets the multiplexer 160 such that its 10 input is connected to its output while all its other inputs are disconnected from the output, and sets the ALU 164 such that its output equals its A input. It is noted that each of the multiplexers 158, 160 and 162 is a conventional 4 input-1 output multiplexer where only a selected single one of its inputs is connected to its output at any particular time, and that the arithmetic logic unit 164 has an output which is a selected function of its two inputs and may be, for example, a unit manufactured by Texas Instruments and identified as SN74181.

With rectangular window function, each of the words $f(n)$ from the memory 64 must be multiplied by 1. With the multiplexers and the ALU set as defined immediately, each of the $f(n)$ words from the memory 64 goes into the 01 input of the multiplexer 158, then goes through the multiplicand register 166, another register 168 into the 10 input of the multiplexer 160, and then into the A input of the ALU 164. The output of the ALU 164 is the work $f(n)$, and at the suitable phase of the phase clock 171 (which goes through two phases for each word $f(n)$) the word $f(n)$ is loaded into the I-register 86 and then into the corresponding memory location of the DFT memory 76. This is repeated for each of the sequence of 1024 words $f(n)$ from the memory 64, with the result that this sequence of N words $f(n)$ is transferred into the DFT memory 76.

For a Hanning window function, each of the words $f(n)$ from the memory 64 must be multiplied by the the expression $[\frac{1}{2} - (\frac{1}{2}) \cos 2\pi(n-\frac{1}{2})/1024)]$. For this, the multiplexer 158 is set to accept only its 00 input, the multiplexer 162 is set to accept only its 00 input, the multiplexer 160 is set to accept only its 10 input, and the ALU 164 is set to add its two inputs if the input signs are the same and to subtract the B input from the A input if the input signs are different. The sign of the output of the ALU 164 is the same as the sign of its A input. In carrying out the Hanning window function multiplication, each of the $f(n)$ words from the memory 64 goes through a circuit 65 which divides it by 2, and then goes through a multiplicand register 166. The halved word $f(n)$ then goes through the register 168 and the multiplexer 160 and into the A input of the ALU 164, and also goes into the multiplier 78 as one of its inputs. The other input of the multiplier 78 is a trigonometric function generated by the coefficient address generator 82 and the trigonometric function ROM 84 and passed through the multiplexer 162 and the multiplier register 176. The output of the multiplier register 176 is the quantity $[\cos 2\pi(n-\frac{1}{2})/1024]$ which is applied as the other input of the multiplier 78. The output of the multiplier 78 is thus the quantity $[(f(n)/2) \cos 2\pi(n-\frac{1}{2})/1024]$ which goes through the register 178 and is applied as the B input of the ALU 164. The output of the ALU 164 is therefore the quantity $f(n)[\frac{1}{2}-(\frac{1}{2})\cos 2\pi(n-\frac{1}{2})/1024)]$ which goes through the AND-gate 179 at the proper phase of the phase clock 170 and passes through the I-register 86 to be stored from there into the corresponding memory location of the DFT memory 76.

In case a special window function is selected by the selector 74 of FIG. 2, the multiplexer 158 of FIG. 11 is set to accept its 01 input, the multiplexer 160 is set to accept its 11 input, the multiplexer 162 is set to accept its 01 input, and the ALU 164 is set to provide an output which is the sum of its two inputs. With this setting, each of the $f(n)$ words from the memory 64 passed through the multiplexer 158 and the multipicand register 166 and becomes one input of the multiplier 78. The other input of the multiplier 78 is a special window function from a generator 174 which may be, for example, a READ ONLY memory storing the desired custom window function. The window function from the generator 174 is applied, through the multiplier register 176 as the other input of the multiplier 78. The output of the multiplier 78 is a sequence of words $f(n).W(n)$ where $W(n)$ is the required special window function from the generator 174. This product of the multiplier 78 is applied, through the register 178, as the B input of the ALU 164. The A input of the ALU 164 is from the multiplexer 160 which is set to its 11 input. The 11 input of the multiplexer 160 may at this time be all zeroes, or it may be a special window function which is to be added to the product of the multiplier 78. In the typical case, the 11 input of the multiplier 160 would be all zeroes, therefore, the output of the ALU 160 would be its B input. This output of the ALU 164 is gated through the AND-gate 170 at the proper phase of the clock 171 and goes through the I-register 86 and into the corresponding memory location of the DFT memory 76.

After the multiplication of a sequence of 1024 words from the memory 64 by the selected window function as described above, and after the step counter 155 advances through a timing delay of two clock cycles, the DFT memory 76 of FIG. 11 contains a sequence of 1024 words $f(n).W(n)$. The step counter 155 then advances to its step 3 for the multiplication of the words $f(n).W(n)$ by the appropriate trigonometric function and for accumulation of the results.

In step 3, the multiplexer 158 is set to accept its 10 input, the multiplexer 160 is set to accept its 01 input during phase 1 of the phase clock 171 and to accept its input 00 during phase 2 of the phase clock 171, the multiplexer 162 is set to accept its 00 input, and the ALU 164 is set to add its two inputs if the output of the multiplier 78 is positive and to subtract its B input from the A input if the output of the multiplier 78 is negative. In step 3 of the step counter 155, each word $f(n).W(n)$ is multiplied by the corresponding sine and cosine coefficients, and the products are added to the contents of the I-register 86 and R-register 84 respectively.

Specifically, a word $f(n).W(n)$ is read from the DFT memory 76 and is stored in the multiplicant register 166 after passing through the 10 input of the multiplexer 158. Meanwhile, the corresponding sine and cosine coefficients are generated from the trigonometric function ROM 84 as discussed previously in this specification and are stored sequentially in the multiplier register 176. The sine and cosine coefficients stored sequentially in the multiplier register 176 are multiplied sequentially with the corresponding $f(n).W(n)$ word by the multiplier 78, and the two products are applied sequentially to the B input of the ALU 164 after passing through the register 178. The A input of the ALU 164 is alternately from the 00 and 01 inputs of the multiplexer 160. The relative timing is such that the A input of the ALU 164 from the 00 input of the multiplexer 160 is synchronized with the output of the multiplier 78 that includes the cosine coefficient, and the A input of the ALU 164 is from the 01 input of the multiplexer 160 at the time the multiplier 78 outputs a product containing the sine coefficient.

The output of the ALU 164 for the first phase of the clock 171 is gated through the gate 172 into R-register 184, and is the sum of the previous contents of the R register 184 and the new function derived from the multiplier 78, while the output of the ALU 164 for the second phase of the clock 171 is gated through the gate 170 into the I-register 86 and is the sum of the previous contents of the I-register 86 and the current sine function from the multiplier 78. After the entire sequence of 1024 words $f(n).W(n)$ from the DFT memory 76 has been processed in this manner, the R-register 84 and the I-register 86 contain, respectively, the real part and the imaginary part of the power value for a spectral line K.

The step counter 155 then advances to step 4 during which the two's complement inversion, if required, is performed on the contents of the registers 84 and 86. For this step the multiplexer 160 is set to accept its 01 input during phase 1 of the phase clock 171 and to accept its 00 input during the second phase of the phase clock 171. The ALU 164 is set as follows: For the first clock cycle of step 4, the output of the ALU 164 is equal to its A input if the A input is positive and is equal to the A input decremented by 1 if the A input is negative; for the second clock cycle of step 4, the output of the ALU 164 is equal to its A input if the A input if the A input is negative. The resulting output of the ALU 164 are two successive positive numbers representing the absolute values of the sums accumulated in the registers 86 and 84 respectively during the immediately preceding step 3 which positive numbers are left stored in registers 86 and 84 respectively.

The step counter 155 then advances to the fifth step in which the contents of the registers 84 and 86 are converted to floating point formats. For this step, the multiplexer 160 is set to accept its 01 input for phase 1 of the phase clock 171 and to accept its 00 input for phase 2 of the phase clock 171. For each cycling of the two phases of the phase clock 171, the ALU 164 shifts the contents of each of the registers 84 and 86 one bit position to the left (or toward the most significant bit) if both of the numbers in the registers 84 and 86 have a binary 0 at the most significant bit position but does not shift either of the numbers if either has a 1 in its most significant bit position. Each time the numbers are shifted, the shifted value is stored again in the registers 84 and 86. For each shift, an originally cleared exponent counter 165 is incremented by 2. When either of the numbers in the registers 84 and 86 has a 1 in its most significant bit position, the step counter 155 is advanced to step 6.

The purpose of step 6 is to square the contents of each of the registers 84 and 86 and to add the two squared values. For this step, each of the multiplexers 158 and 162 accepts its 11 input, the multiplexer 160 accepts its 01 input, and the ALU 164 provides its B input at its output for phase 1 of the phase clock 171, and provides at its output the sum of its inputs for the second phase of the phase clock 171. The output of the ALU 164 for the two phases of a cycle of the phase clock 171 is thus the sum of the squares of the previous contents of the registers 84 and 86, and this is stored in the I-register 86. During the first phase of the last cycle of the clock 171 in step 5, the contents of the I-register 86 are placed into the registers 166 and 176 through the 11 inputs of the multiplexers 158 and 162. On the second phase of the last clock period in step 5, the multiplier 78 computes the square of the contents of the I-register 86, and the contents of the R-register 84 are placed in the I-register 86 through the 00 input of the multiplexer 160 and through the ALU 164. On the first phase of the first cycle of step 6, the square of the original contents of the I-register 86 ($I^2$) is placed into the register 178 and passes through the B input of the ALU 164, while the value R which is now in the I-register 86 is placed in the registers 166 and 176 and is squared by the multiplier 78. On the second phase of the cycle of step 6, the output of the multiplier 78, which is the value $R^2$ is placed into the register 178, while the value ($I^2$) is placed into the I register 86 and appears as the A input of the ALU 164 after passing through the 01 input of the multiplexer 160. The output of the ALU 164 at this time is the sum of the squares of the values R and I. In the first phase of the next cycle of the clock 171, the sum of the squares of the values R and I is placed into the I-register 86. The I-register 86 now contains the value $X_K$ discussed earlier in this specification.

In step 7, the purpose is to adjust the floating point of the number $X_K$ which is in the I-register 86 at this time, if necessary, and to output that number into the device for averaging discussed earlier in this specification. For this step the multiplexer 160 is set to accept its 01 input and the ALU 164 is set to shift its A input 1 bit position to the left if the most significant bit of the input is 0 and to simply output its A input if the most significant bit of the input is a binary 1. For each shift at this time, one count is added to the exponent counter 165. At this time, the contents of the I-register 86 and of the exponent counter 165 together represent the value $X_K$ discussed earlier and can be output through suitable gates 167a and 167b enabled by a suitable control pulse. The output of the gates 167a and 167b is placed in the recirculating memory array 98 of FIG. 2, following the averaging algorithm manipulation in the location corresponding to the specific K-th spectral line whose power value was computed as described in connection with FIG. 11.

If K does not equal 256 at the end of step 7, the step counter 155 returns to step 3. The sequence from step 3 through step 7 is repeated for each value of K until K = 256. Then the step counter 155 returns to step 0 having completed one entire set of power values. A selected number of sets of these power values may be averaged and displayed as discussed in detail in connection with FIGS. 9 and 10.

We claim:

1. A spectrum analyzer comprising:
    means for generating P successive sequences of digital words (where $p = 1, 2, \ldots, P$), each sequence p representing the time history of an analog signal over a selected time interval;
    means for receiving said P sequences of digital words from the generating means and for forming a set of P power values $X_{k,p}$ for each of K spectral lines (where $k = 1, 2, 3, \ldots, K$), each power value $X_{k,p}$ representing the power spectrum of the k-th spectral line for the p-th sequence of digital words; and
    means for receiving said K·P power values from the forming means and for averaging the P power values of each of the K spectral lines, comprising means for providing averaging signals representing the expression $p^{-1}2^b (aY_{k,p-1} + 2^{-b} X_{k,p})$, where $Y_{k,p-1}$ represents the value of the term inside the parenthesis for the (p-1) sequence of digital words, (b) is defined by the relationship ($2^{b-1} < p \leq 2^b$), and (a) is ½ if ($p-1 = 2^{b-1}$) and is 1 otherwise.

2. A spectrum analyzer as in claim 1 wherein the means for providing signals representing said expression comprises p-counter means responsive to the generation of each sequence of digital words from the generating means to provide an output signal representing the current value of (p), b-calculator means for receiving the output of the p-counter counter means and for providing an output signal representing the current value of (b), a-calculator means for receiving the outputs of the p-counter means and the b-calculator means and for providing an output signal representing the current value of (a), ($2^{-b}$) calculator means for receiving the output of the b-calculator means and for providing an output representing ($2^{-b}$), first multiplier means receiving as inputs the sequences of digital words from the generating means and the output of the $2^{-b}$-calculator means and for providing an output which is the product of its inputs, means for providing the value of said term inside the parenthesis of said expression, second multiplier means for receiving as inputs the last recited term and the output of the a-calculator means and for providing at its output the product of its inputs, summing means for receiving as its inputs the outputs of the first and the second multiplier means and for providing at its output the sum of its inputs, correction factor generator means for receiving as inputs the outputs of the p-counter means and of the b-calculator means and for providing at its output a signal representing ther term ($p^{-1}2^b$), and third multiplier means for receiving as inputs the outputs of the summing means and of the correction factor generator means and for providing an output which is the product of its input, the last recited output being an averaging signal representing said expression for the value of (p) provided by the p-counter means.

3. A spectrum analyzer as in claim 2 wherein the inputs to the first and second multiplier means are represented in binary code and wherein each of the first and second multiplier means comprise a shift register carrying out multiplication by selective shifts of its contents toward the least significant bit.

4. A spectrum analyzer as in claim 1 wherein the generating means include means for generating, after the generation of said P sequences, Q additional sequences of digital words ($q = 1, 2, \ldots, Q$) representing the time history of the analog signal over a selected time interval, the forming means include means for receiving said Q sequences and for forming Q power values $X_{k,q}$ for each of the K spectral lines, and including exponential mode averaging means for receiving the signal representing the recited expression at $p = P$, the value of P and the power values $X_{k,q}$ and for providing, at the q-th sequence of digital words, an output signal representing the expression $Y_{k,q-1} + 2^{-c} (X_{k,q} - Y_{k,q-1})$, where $Y_{k,q-1}$ is the value of the term in the parenthesis for the k-th spectral line and the q-1 sequence of digital words, and $c = \log_2 P$.

5. A spectrum analyzer as in claim 4 wherein the exponential mode averaging means comprise:

memory means for storing signals representing the term $Y_{k,q-1}$ and for providing corresponding output signals;

substract means for receiving as inputs the output of the last recited memory means and the $K \cdot Q$ sequences of power values $X_{k,q}$ and for providing an output representing the difference between its inputs;

means for generating an output signal representing the term $2^{-c}$;

multiply means receiving as inputs the outputs of the $2^{-c}$ generating means and of the substract means and for providing an output signal representing the product of its inputs; and sum means for receiving as inputs the outputs of the last recited memory means and the last recited multiply means and for providing an output signal representing the sum of its inputs, said last recited sum being the value of the last recited expression.

6. A spectrum analysis method comprising the steps of:

generating P successive sequences of digital words (where $p = 1, 2, \ldots, P$), each sequence $p$ representing the time history of an analog signal over a selected time interval, generating a set of power values $X_{k,p}$ (where $k = 1, 2, 3, \ldots, K$), each power value $X_{k,p}$ representing the power spectrum of a spectral line $k$ for the p-th sequence of digital words; and averaging the P power values of each of the K spectral lines to provide signals representing the expression $p^{-1}2^b (aY_{k,p-1} + 2^{-b} X_{k,p})$, where $X_{k,p-1}$ represents the value of the term inside the parenthesis for the p-1 sequence of digital words, $(b)$ is defined as $2^{b-1} < p \leq 2^b$, and $(a)$ is ½ if $p-1 = 2^{b-1}$ and is 1 otherwise, the value of the expression being a sum mode average of said power values.

7. A method as in claim 6 including the additional steps of: generating Q additional sequences of digital words (where $q = 1, 2, \ldots, Q$) and corresponding power values $X_{k,q}$; receiving the signal representing the recited expression at $p = P$; providing at the q-th sequence of digital words an output signal representing the expression $Y_{k,q-1} + 2^{-c}(X_{k,q} - Y_{k,q-1})$, where $Y_{k,q-1}$ is the value of the term in the parenthesis of the last recited expression for the k-th spectral line and the q-1 sequence of digital words and $c = \log_2 P$, the last recited output signal representing an exponential mode average of the power values.

8. A spectrum analyzer comprising:

means for deriving a sequence of digital words representing the time history of an analog signal over a selected time interval;

first and second multiplexer means each having a plurality of inputs and an output;

first memory means for storing said digital words and means for applying the contents of said first memory means to a first input of the first multiplexer means;

second memory means and means for applying its contents to a second input of the first multiplexer means;

means storing the values of a single trigonometric function for one quadrant thereof and means for generating therefrom two selected trigonometric functions in selected correspondence to each digital word from the first memory means applied to said first multiplexer means and means for applying said functions to a first input of the second multiplexer means;

first multiplier means having two inputs and an output providing the product of its inputs;

first and second register means;

arithmetic-logic unit means (ALU) having a first and a second input and an output providing a signal which is a defined arithmetic or logic function of its inputs; and control means including means for causing the first multiplexer means to connect its first input to its output and for causing the second multiplexer means to connect its first input to its output;

means for connecting the outputs of the first and the second multiplexer means to the inputs of the first multiplier means to cause the first multiplier means to provide at its output the product of selected digital words and values of said trigonometric function;

means for alternately storing the output of the first multiplier means in the first and second register means;

means for applying the contents of the first and second register means to the inputs of the ALU means to provide a defined function thereof at the output of the ALU means; and means for storing the output of the ALU means in the second memory means and means for processing the contents of the second memory means to derive a succession of power values representing the power spectrum of said analog signal.

9. A spectrum analyzer as in claim 8 including means for generating a special window function applied to the second multiplexer means, and wherein the control means includes means, operative prior to the connection of the first inputs of the multiplexer means to the outputs thereof by the control means, for causing the first multiplexer means to connect only its second input to its output and for causing the second multiplexer means to connect only its second input to its output and means for combining the outputs of the multiplexer means in accordance with a selected function.

10. A spectrum analyzer comprising memory means for storing a set of digital words $f(n)$ representing the time history of an analog signal over a selected time interval;

DFT memory means for storing a corresponding set of intermediate results;

trigonometric memory means for storing the values of a single trigonometric function for only one quadrant thereof;

first, second and third multiplexer means having a number of inputs and a single output that can be connected to a single selected input only;

an R register and an I register, window function storing means and arithmetic means having inputs and an output and providing selected arithmetic and logic functions of its inputs and its output;

means for initially applying the words from the $f(n)$ memory and the window function from the window function storing means to selected inputs of different ones of said multiplexer means, means for concurrently connecting the outputs of the last recited multiplexer means to the last recited inputs thereof, means for applying the last recited multiplexer means outputs to the inputs of the arithmetic means and for causing the arithmetic means to provide at its output a selected function of its inputs, and means for storing the last recited output of the arithmetic means in the DFT memory means;

means for subsequently applying the contents of theh DFT memory means and the contents of the trigonometric memory means in selected relative synchronism for each of K spectral lines ($k = 1, 2, . . . , K$) to selecting inputs of different ones of said multiplexer means, means for concurrently connecting the outputs of the last recited multiplexer means to the last recited inputs thereof, means for applying the last recited multiplexer means outputs to the inputs of the arithmetic means and for causing the arithmetic means to provide at its ouput a selected function of its inputs, and means for storing the output of the arithmetic means in the R or the I register depending on the trigonometric function concurrently provided from the trigonometric memory means, the storage in the R and I registers being cumulative; and means for subsequently applying the contents of the R and I registers, for each of said K spectral lines, to selected inputs of different ones of said multiplexer means, means for connecting the outputs of the last recited multiplexer means to the last recited inputs thereof, means for connecting the last recited outputs of the multiplexer means to the inputs of the arithmetic means and for causing the arithmetic means to provide at its output the sum of the squares of the contents of the R and I registers, said sum being representative of the power spectrum value of the corresponding spectral line.

* * * * *

UNITED STATES PATENT OFFICE
CERTIFICATE OF CORRECTION

Patent No. 3,984,669  Dated October 5, 1976

Inventor(s) Joseph L. Lehmann et al.

It is certified that error appears in the above-identified patent and that said Letters Patent are hereby corrected as shown below:

Column 6, line 36, change "and" to -- as --

Column 10, line 25, change "$\pm$" to -- $\underline{x}$ --

Column 12, line 33, after "120" change "in" to -- is --

Column 13, line 21, delete "Au" and insert -- Av --

Column 14, line 12, delete "$(P/2^2)$" and insert -- $(P/2^b)$ -- line 66, delete "$\log_2$" and insert -- log --

Column 16, line 68, change "179" to -- 170 --

Column 18, line 35, after "input" second occurence insert -- is positive and is equal to the negation of the A input --

Column 22, line 54, after "means" insert -- each --

Column 23, line 6, change "theh" to -- the --

Signed and Sealed this fifth Day of July 1977

[SEAL]

Attest:

RUTH C. MASON
Attesting Officer

C. MARSHALL DANN
Commissioner of Patents and Trademarks